United States Patent
You et al.

(10) Patent No.: US 7,077,929 B2
(45) Date of Patent: Jul. 18, 2006

(54) APPARATUS FOR MANUFACTURING A SEMICONDUCTOR DEVICE

(75) Inventors: Young-Sub You, Gyeonggi-do (KR); Jae-Woong Kim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/835,372

(22) Filed: Apr. 28, 2004

(65) Prior Publication Data

US 2004/0219772 A1    Nov. 4, 2004

(30) Foreign Application Priority Data

Apr. 29, 2003   (KR) ...................... 10-2003-0027176

(51) Int. Cl.
H01L 21/306 (2006.01)
C23F 1/00 (2006.01)
C23C 16/00 (2006.01)

(52) U.S. Cl. ........................... 156/345.32; 156/345.31; 118/719

(58) Field of Classification Search ................ 438/706; 118/719; 414/935, 937, 939; 156/345.32, 156/345.31, 345.13
See application file for complete search history.

(56) References Cited

U.S. PATENT DOCUMENTS 6,530,993 B1 *   3/2003   Hwang et al. ............... 118/719

2003/0136515 A1 *   7/2003   Saeki et al. .................. 118/719
2005/0064714 A1 *   3/2005   Mui et al. .................... 438/706

FOREIGN PATENT DOCUMENTS

| KR | 1994-16602 | 7/1994 |
|---|---|---|
| KR | 010004969 A | 1/2001 |
| KR | 10200020030994 A | 4/2002 |
| KR | 2002-40445 | 5/2002 |

OTHER PUBLICATIONS

English Language Abstract of Korean Publication No. 010004969 A.
English Language Abstract of Korean Publication No. 10200020030994 A.
English language abstract of Korean Publication No. 1994-16602.
English language abstract of Korean Publication No. 2002-40445.

* cited by examiner

*Primary Examiner*—Walter L. Lindsay, Jr.
(74) *Attorney, Agent, or Firm*—Marger Johnson & McCollom, P.C.

(57) ABSTRACT

An apparatus for manufacturing a semiconductor includes a polyhedral transfer chamber, a first process module for forming a gate dielectric layer by ALD, and a second process module for thermally treating the gate dielectric layer. The first process module is in communication with a first side of the transfer chamber. The second process module in communication with a second side of the transfer chamber. The apparatus further includes at least one load-lock chamber in communication with a third side of the transfer chamber.

17 Claims, 4 Drawing Sheets

APPARATUS FOR MANUFACTURING A SEMICONDUCTOR DEVICE

CROSS REFERENCE TO RELATED APPLICATION

This application claims priority under 35 USC § 119 to Korean Patent Application No. 2003-27176, filed on Apr. 29, 2003, the contents of which are herein incorporated by reference in their entirety for all purposes.

BACKGROUND OF THE INVENTION

1. Field of the Invention

The present invention relates to an apparatus for manufacturing a semiconductor device. It also relates to a method of forming the same.

2. Description of the Related Art

Memory devices, such as those used in computers, are just one of many widely used semiconductor devices. From a functional point of view, it is required that semiconductor devices operate at a rapid speed and simultaneously have a great amount of storage capacity. To meet these requirements, technologies for fabricating semiconductor devices have been developed to improve their degree of integration, reliability, and response speed.

In particular, as design rules have decreased for improving the degree of integration of semiconductor devices, a gate insulating layer is required to have a thin thickness and a small width in semiconductor devices such as a highly integrated dynamic random access memory (DRAM), a static random access memory (SRAM), a flash memory, etc. A gate oxide layer having a thickness of below about 10 Å is demanded in a logic circuit that drives a memory circuit.

On the other hand, process integration has been promoted in the semiconductor industry to meet technological and economical requirements. The process integration is defined as carrying out complex processes performed in different process chambers in a single cluster tool. The single cluster tool includes several chambers that are interconnected by a platform to continuously perform different processes.

Various methods for manufacturing semiconductor devices using a cluster tool are known in the art. For instance, a method of forming a gate oxide layer of a semiconductor device is disclosed in Korean Patent Laid Open Publication No. 2001-0004969. According to the method, a sheet-off process is performed on a surface of an active region provided on a substrate to remove a native oxide layer formed on the surface of the active region. An aluminum oxide layer is formed on the surface of the active region in an atomic layer deposition (ALD) chamber. The aluminum oxide layer is annealed in a reacting furnace under an $N_2O$ atmosphere to remove defects in the aluminum oxide layer, and to form an oxide nitride layer between the substrate and the aluminum oxide layer. A polysilicon layer is formed on the aluminum oxide layer. A word line including tungsten silicide, titanium silicide or tungsten is formed on the polysilicon layer.

When the substrate is, however, transported to the reacting furnace, vacuum may not be provided to the substrate. This causes growth of a native oxide layer on the aluminum oxide layer. As a result, it may be impossible to form a gate oxide layer having a thickness of below about 15 Å due to the native oxide layer.

Further, a cluster tool having high-pressure and heat-treatment chamber, and a method of forming a thin layer using the same are disclosed in Korean Patent Laid Open Publication No. 2002-0030994. A cluster tool includes a polyhedral transfer chamber for providing an isolated space in which a substrate is transferred. A load-lock chamber is connected to a first side face of the transfer chamber. Process chambers are connected to second side faces of the transfer chamber. A batch type high-pressure and heat-treatment chamber is connected to a third face of the transfer chamber. The substrate that is processed in the process chambers is loaded into the high-pressure and heat-treatment chamber. A substrate transferring member transports the substrate between the load-lock chamber, the process chambers and the high-pressure and heat-treatment chamber.

Since the batch type high-pressure and heat-treatment chamber is employed in the cluster tool, a native oxide layer grows on a gate oxide layer formed on the substrate to a thickness of above about 10 Å. A gate electrode formed on the gate oxide layer having a thicker thickness may deteriorate the reliability of a semiconductor. It may be difficult to form a gate oxide layer having a thickness of below about 15 Å using the conventional cluster tool. Furthermore, the substrate may be transported to another chamber for forming a gate electrode or a contact electrode. Accordingly, even though a gate oxide layer having a thickness of below about 15 Å may be formed using the conventional cluster tool, a native oxide layer may grow on the gate oxide layer during transportation of the substrate. The gate oxide layer may not have a desired thickness owing to the native oxide layer. The native oxide layer may include particles that deteriorate performance and reliability of a semiconductor.

SUMMARY OF THE INVENTION

In one embodiment, an apparatus for manufacturing a semiconductor comprises a polyhedral transfer chambers, a first process module for forming a gate dielectric layer by ALD, and a second process module for thermally treating the gate dielectric layer. The first process module is in communication with a first side of the transfer chamber. The second process module is in communication with a second side of the transfer chamber. The apparatus further includes at least one load-lock chamber in communication with a third side of the transfer chamber.

Preferably, the apparatus further comprises another module for forming a first gate electrode on the gate dielectric layer using ALD.

In another embodiment, a method for forming a gate electrode comprises loading a substrate into a clustered apparatus; forming a gate dielectric layer on the substrate using an ALD method in the clustered apparatus; thermally treating the substrate having the gate dielectric layer formed thereon to densify the gate dielectric layer in the clustered apparatus; and forming a first gate electrode on the thermally treated gate oxide layer in the clustered apparatus.

The above and other features and advantages of the invention will become readily apparent by reference to the following detailed description when considered in conjunction with the accompanying drawings.

DESCRIPTION OF THE PREFERRED EMBODIMENTS

Figure 1:
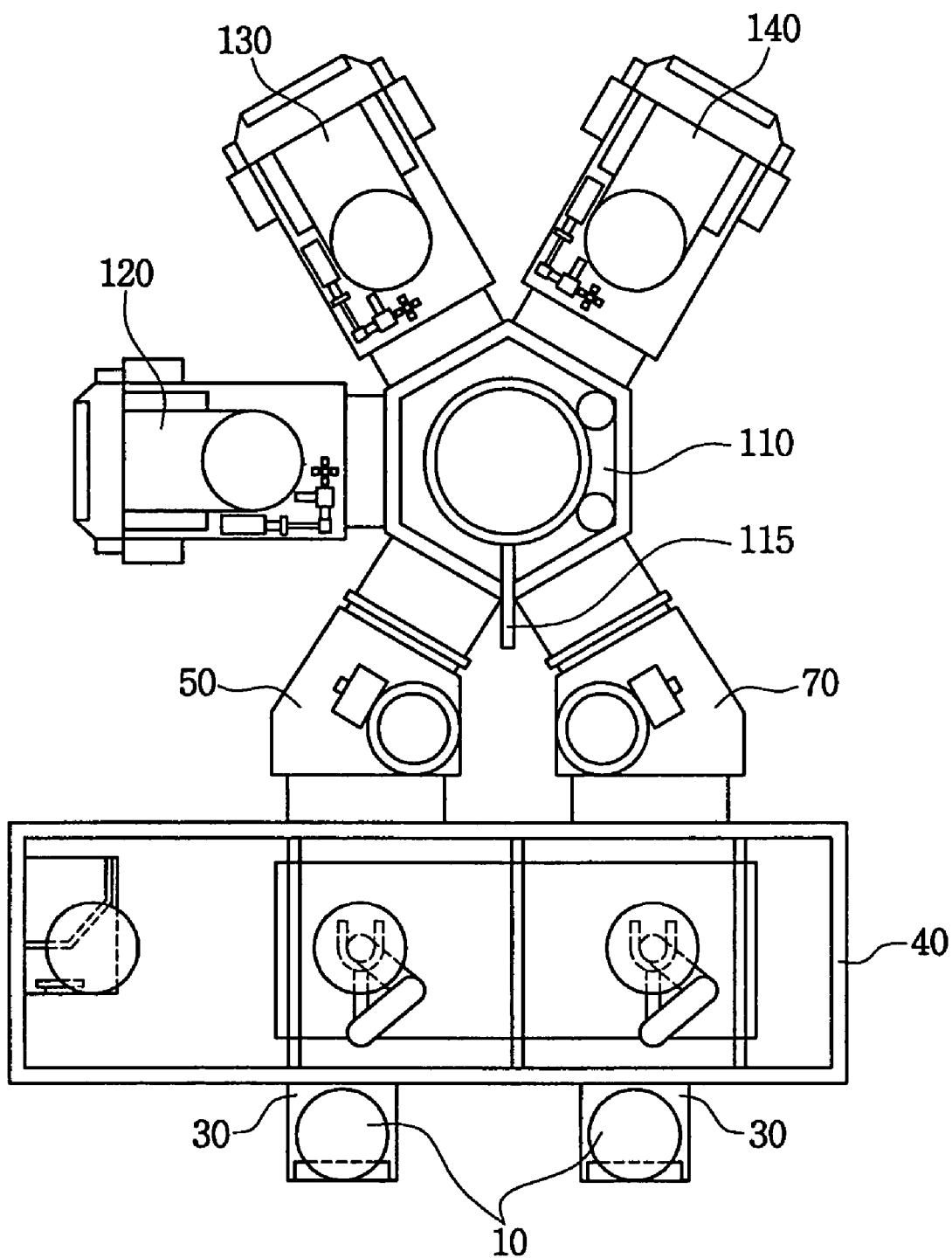
FIG. 1 is a plan view illustrating an apparatus for manufacturing a semiconductor device in accordance with an embodiment of the present invention.

The present invention now will be described more fully hereinafter with reference to the accompanying drawings, in which embodiments of the present invention are shown. This invention may, however, be embodied in many different forms and should not be construed as limited to the embodiments set forth herein; rather, these embodiments are provided so that this disclosure will be thorough and complete, and will fully convey the scope of the present invention to those skilled in the art. In the drawings, the thickness of layers and regions are exaggerated for clarity. Like reference numbers refer to similar or identical elements throughout. It will be understood that when an element such as a layer, region or substrate is referred to as being "on" or "onto" another element, it can be directly on the other element or intervening elements may also be present.

Hereinafter, an apparatus for manufacturing a semiconductor device and a method of forming a gate structure according to the present invention are illustrated in detail.

Referring to FIG. 1, an apparatus 100, e.g., a single-substrate type clustered apparatus[100], for manufacturing a semiconductor device includes a polyhedral transfer chamber 110, a first and a second process modules 120 and 130, and load-lock chambers 50 and 70. The transfer chamber 110, the first and the second process modules 120 and 130, and the load-lock chambers 50 and 70 are interconnected via a single platform. Thus, the apparatus 100 may perform complex processes for manufacturing a semiconductor device in continuous vacuum so that growth of a native oxide layer on a substrate may be suppressed and contaminants, such as particles, may be not created.

The first and the second process modules 120 and 130, and the load-lock chambers 50 and 70 are connected to sides of, and are in communication with, the polyhedral transfer chamber 110, respectively. The numbers of the polyhedral sides may be determined in accordance with the complexity of the processes.

A substrate 10 is transferred to the transfer chamber 110 subsequently through a substrate cassette 30, a substrate transfer unit 40 and the load-lock chamber 50. After a process is performed on the substrate 10 in the first process module 120, the substrate 10 is transferred to the second process module 130 through the transfer chamber 110 by a substrate transporting member such as a robot arm 115. After the substrate 10 is loaded into the load-lock chamber 50, the interior of the apparatus 100 is maintained under vacuum so that growth of a native oxide layer on the substrate 10 may be suppressed and particles may be not created.

The first process module 120 is connected to, and is in communication with, a first side of the transfer chamber 110. The first process module 120 may include diverse process chambers in accordance with a process carried out therein. The first process module 120 may include a module for forming a gate oxide layer, such as an atomic layer deposition (ALD) chamber or a chemical vapor deposition (CVD) chamber. Preferably, the first process module 120 may include the ALD chamber for forming an oxide layer having a thickness of not more than about 15 Å.

The gate oxide layer may include a silicon oxide layer or a silicon oxynitride layer. A silicon source including $SiCl_4$, $Si_2Cl_6$ or $SiH_4$ can be reacted with an oxygen source including $H_2O$, $O_2$, $N_2O$ or $O_3$ to form the silicon oxide layer. A silicon source including $SiCl_4$, $Si_2Cl_6$ or $SiH_4$ is reacted with an oxygen source including $H_2O$, $O_2$, $N_2O$ or $O_3$ and a nitrogen source including $NH_4$ or $N_2H_4$ to form the silicon oxynitride layer.

Alternatively, the first process module 120 may include a chamber for performing complex processes that include the removal of a native oxide layer and the formation of a gate oxide layer. That is, a wet cleaning process is performed on a substrate 10 using a chemical such as hydrogen fluoride (HF) in the first process module 120 to remove any native oxide layer formed on the substrate 10. A gate oxide layer is formed on the substrate 10 in the first process module 120. Since the complex processes are carried out in the first process module 120, the numbers of chambers may be decreased. Additionally, since the time for transferring the substrate 10 to another chamber is not needed, the amount of the substrate 10 treated per unit time may be increased. In particular, the gate oxide layer having a thickness of not more than about 15 Å may be formed using the first process module 120 because the native oxide layer is removed from the substrate 10.

The second process module 130 is preferably connected to, and in communication with, a second side of the transfer chamber 110. The second process module 130 may include a chamber for depositing polysilicon used as a first gate electrode. When the first process module 120 may be used for forming a gate dielectric layer such as a gate oxide layer, or for removing a native oxide layer and forming a gate oxide layer, and the second process module 130 may be used for forming a gate electrode, the complex processes are performed in the single-substrate type clustered apparatus 100 so that a gate structure having a thin gate oxide layer may be formed. The gate structure may be employed in a memory device, for example, a DRAM, an SRAM and a flash memory, to improve reliability of a semiconductor device.

In addition, when the second process module 130 may be used for forming a first gate electrode, a third process module 140 for forming a second gate electrode may be further connected to, and in communication with, a third side of the transfer chamber 110. The third process module 140 may include a chamber for depositing metal. The second gate electrode may include a material used for reducing a resistance of the first gate electrode such as tungsten, tungsten silicide or titanium silicide.

Alternatively, the second process module 130 may include a chamber for performing complex processes that include a heat treatment of a gate oxide layer and the formation of a gate electrode. That is, a gate oxide layer formed on the substrate 10 is thermally treated using a rapid thermal annealing (RTA) process at a temperature of about 500° C. to about 1,100° C. A gate electrode may be formed on the annealed gate oxide layer. Since the complex processes are carried out in the second process module 130, the numbers of chambers required for manufacturing a semiconductor device may be decreased. Additionally, since the time for transferring the substrate 10 to another chamber is not needed, the amount of the substrates 10 which can be treated per unit time may be increased.

Separate chambers for performing the complex processes, respectively, may be provided to the apparatus 100. Namely, when the first process module 120 may be used for forming a gate oxide layer, a fourth process module (not shown) for removing a native oxide layer may be connected to, and in communication with, a fourth side of the transfer chamber 110.

Further, when the second process module 130 is used for forming a first gate electrode, a fifth process module (not shown) for thermally treating a gate oxide layer may be connected to, and in communication with, the fourth side of the transfer chamber 110. An RTA process may be carried out in the fifth process module at a temperature of about 500° C. to about 1,100° C.

Figure 2:
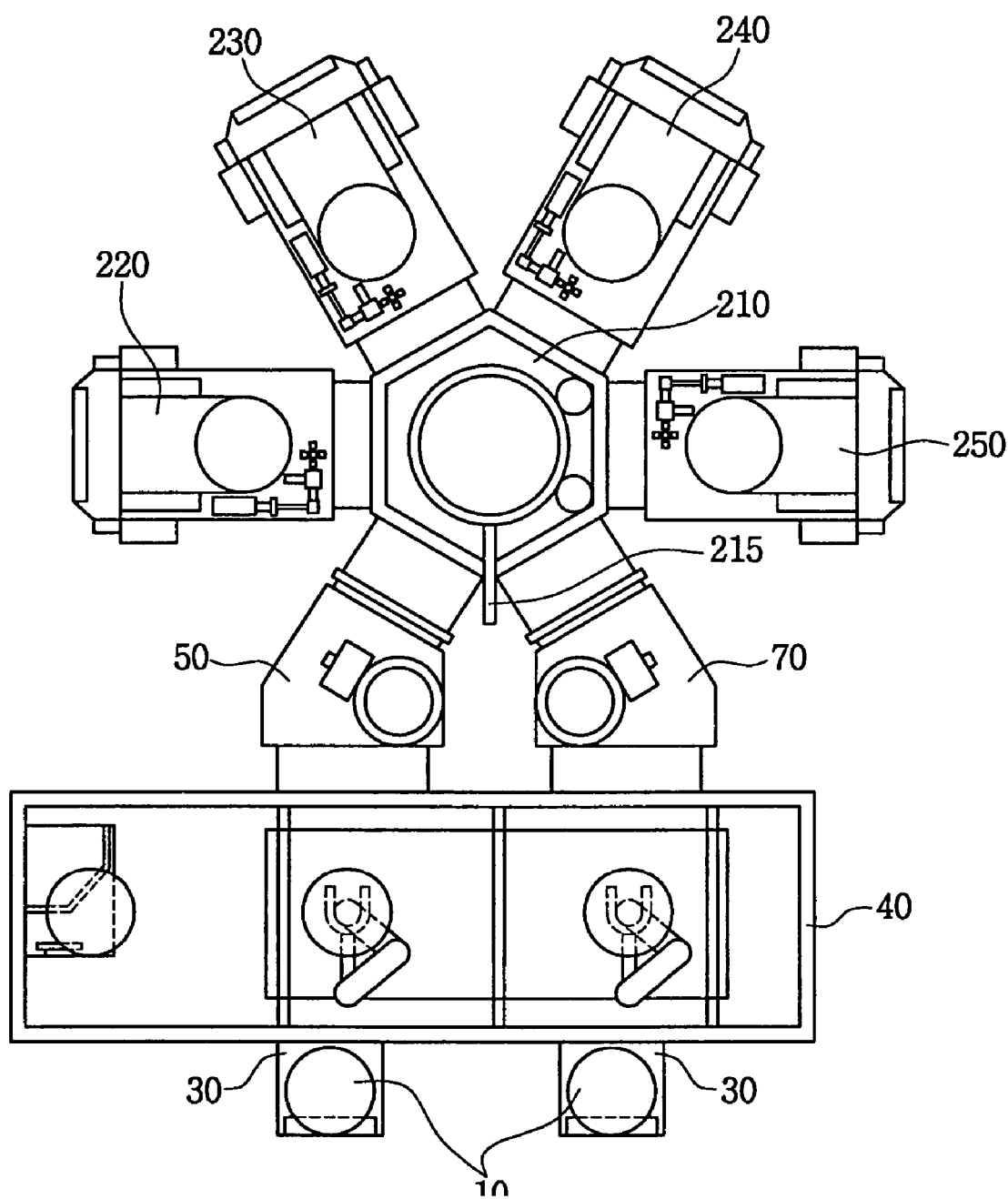
FIG. 2 is a plan view illustrating an apparatus for forming a gate electrode in accordance with another embodiment of the present invention.

Referring to FIG. 2, a single-substrate type clustered apparatus 200 for forming a gate electrode includes a polyhedral transfer chamber 210, a first process module 220 for removing a native oxide layer, a second process module 230 for forming a gate oxide layer, a third process module 240 for thermally treating a gate oxide layer, a fourth process module for forming a first gate electrode, and load-lock chambers 50 and 70. The load-lock chambers 50, 70 and 210 and the modules 220, 230, 240 and 250 are interconnected via a single platform. Thus, the apparatus 200 may perform complex processes for manufacturing a semiconductor device under continuous vacuum so that growth of a native oxide layer may be suppressed and contaminants, such as particles, may be not created.

The load-lock chambers 50 and 70 and the modules 220, 230, 240 and 250 are preferably connected to sides of, and are in communication with, the polyhedral transfer chamber 210, respectively. A substrate 10 is transferred to the transfer chamber 210 subsequently through a substrate cassette 30, a substrate transfer unit 40 and the load-lock chamber 50. After a process is performed on the substrate 10 in any module among the modules 220, 230, 240 and 250, respectively, the substrate 10 is transferred to another module through the transfer chamber 210 by a substrate transporting member such as a robot arm 215. After the substrate 10 is loaded into the load-lock chamber 50, the interior of the apparatus 200 is maintained under vacuum so that growth of a native oxide layer may be suppressed and particles may be not created.

The first process module 220 is preferably connected to, and is in communication with, a first side of the transfer chamber 210. A wet cleaning process is performed on a substrate 10 using a chemical such as hydrogen fluoride (HF) in the first process module 220 to remove a native oxide layer formed on the substrate. A gate oxide layer having a thickness of below about 15 Å may be formed using the apparatus 200 because the native oxide layer is removed from the substrate 10.

The second process module 230 is preferably connected to, and is in communication with, a second side of the transfer chamber 210. The second process module 230 may include an ALD chamber or a CVD chamber. The gate oxide layer may include silicon oxide or silicon oxynitride.

The third process module 240 is preferably connected to, and is in communication with, a third side of the transfer chamber 210. An RTA process may be performed in the third process module 240 at a temperature of about 500° C. to about 1,100° C. The gate oxide layer is thermally treated to improve its property.

The fourth process module 250 for forming the first gate electrode is connected to, and is in communication with, a fourth side of the transfer chamber 210. The fourth process module 250 may include a chamber for depositing polysilicon.

Additionally, the apparatus 200 may further include a fifth process module (not shown) for forming a second gate electrode. The fifth process module may be connected to, and is in communication with, a side of the transfer chamber 210. The fifth process module may include a chamber for depositing metal. The second gate electrode may include a material used for reducing a resistance of the first gate electrode, for example, tungsten, tungsten silicide or titanium silicide.

Figure 3:
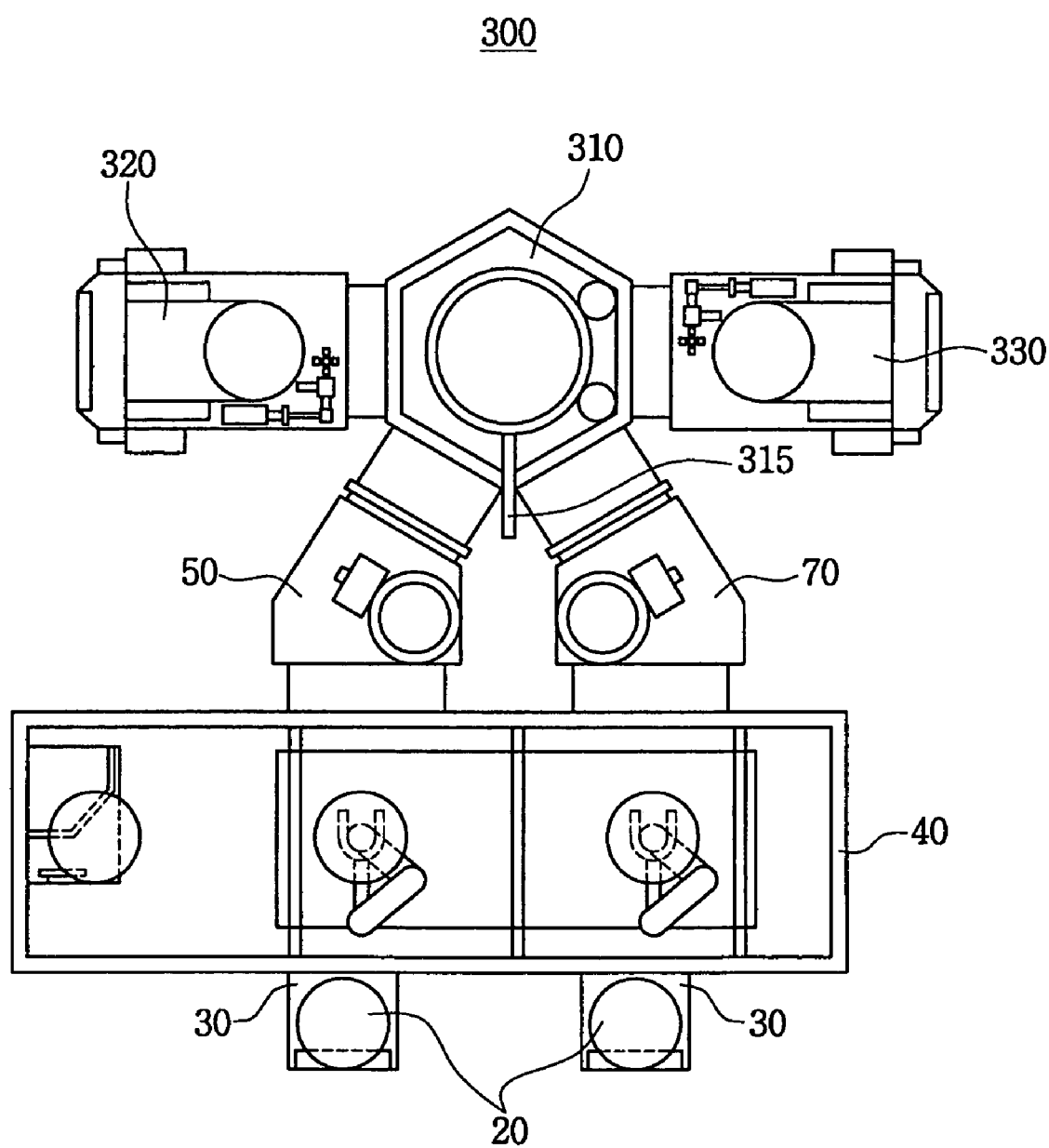
FIG. 3 is a plan view illustrating an apparatus for forming a contact electrode in accordance with yet another embodiment of the present invention.

Referring to FIG. 3, a single-substrate type clustered apparatus 300 for forming a contact electrode includes a polyhedral transfer chamber 310, a first process module 320 for removing a native oxide layer, a second process module 330 for forming a contact electrode, and load-lock chambers 50 and 70. The load-lock chambers 50, 70 and 210 and the first and second modules 320 and 330 are interconnected via a single platform. Thus, the apparatus 300 may perform complex processes for manufacturing a semiconductor device under continuous vacuum so that growth of a native oxide layer may be suppressed and contaminants, such as particles, may be not created.

The load-lock chambers 50 and 70 and the first and second modules 320 and 330 are connected to sides of the polyhedral transfer chamber 310, respectively. A substrate 10 having a lower structure is transferred to the transfer chamber 310 subsequently through a substrate cassette 30, a substrate transfer unit 40 and the load-lock chamber 50. The lower structure may include a gate oxide layer pattern and first and second gate electrode patterns. In this embodiment, the contact electrode may be electrically connected to source/drain regions on the substrate 10.

The first process module 320 is preferably connected to, and is in communication with, a first side of the transfer chamber 310. A wet cleaning process is performed on a substrate 10 using a chemical such as hydrogen fluoride (HF) in the first process module 320 to remove a native oxide layer formed on the lower structure. A resistance of the contact electrode may be reduced because the native oxide layer is removed from the substrate 10.

The second process module 330 is preferably connected to, and is in communication with, a second side of the transfer chamber 310. The second process module 330 may include an ALD chamber or a CVD chamber.

In above-described embodiments, the apparatuses 100, 200 and 300 have a cluster type. The apparatuses 100, 200 and 300 may perform complex processes for manufacturing a semiconductor device under continuous vacuum so that growth of a native oxide layer may be suppressed. Accordingly, a highly integrated semiconductor device having a thin gate oxide layer may be manufactured using the apparatuses 100, 200 and 300. Further, the apparatuses 100, 200 and 300 have a single-substrate type so that processing conditions of the complex process may be accurately controlled.

Figure 4:
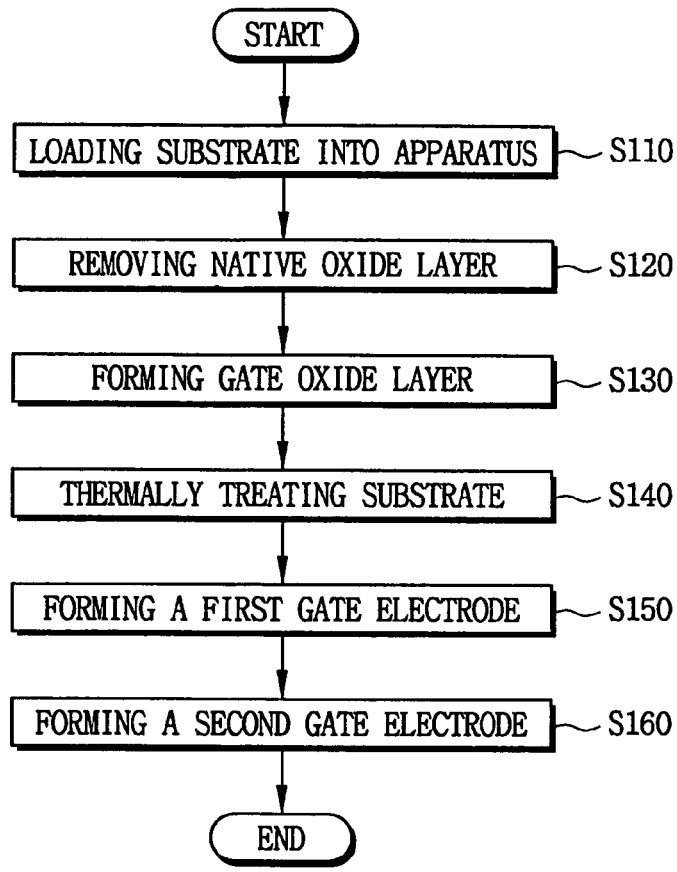
FIG. 4 is a flow chart illustrating a method of forming a gate electrode in accordance with a still another embodiment of the present invention.

Referring to FIG. 4, in step S110, a substrate is loaded into the apparatus in accordance with an embodiment of the present invention. In step S120, a native oxide layer is removed from the substrate. In step S130, a gate oxide layer is formed on the substrate. In step S140, the substrate is thermally treated. Finally, in step S150, a first gate electrode is formed on the gate oxide layer.

The method of forming the gate electrode in accordance with the first embodiment of the present invention may be carried out using the apparatus 200.

Referring to FIGS. 2 and 4, in step S110, the substrate 10 is loaded into the apparatus 200. The substrate 10 is transported from the substrate cassette 30 to the substrate transferring unit 40. The substrate 10 is transported to the load-lock chamber 50 using the substrate transferring unit 40. Vacuum is provided into the apparatus 200. The interior of the apparatus 200 may be maintained under vacuum, thereby preventing the growth of a native oxide layer and contamination by particles.

In step 120, the native oxide layer formed on the substrate 10 is removed. Particularly, the substrate 10 is transported to the first process module 220 using the robot arm 215. The native oxide layer is removed by a wet cleaning process using hydrogen fluoride.

In step 130, the gate oxide layer is formed on the substrate 10. In particular, the substrate 10 is transported to the second process module 230, using the robot arm 215. The gate oxide layer is formed using an ALD process or a CVD process. Preferably, the gate oxide layer may be formed by the ALD process. The gate oxide layer may include a silicon oxide layer or a silicon oxynitride layer. A silicon source including $SiCl_4$, $Si_2Cl_6$ or $SiH_4$ is reacted with an oxygen source including $H_2O$, $O_2$, $N_2O$ or $O_3$ to form the silicon oxide layer. A silicon source including $SiCl_4$, $Si_2Cl_6$ or $SiH_4$ is reacted with an oxygen source including $H_2O$, $O_2$, $N_2O$ or $O_3$ and a nitrogen source including $NH_4$ or $N_2H_4$ to form the silicon oxynitride layer.

In step S140, the substrate 10 is transported to the third process module 240 using the robot arm 215. The substrate 10 is thermally treated by an RTA process at a temperature of about 500° C. to about 1,100° C.

In step S150, the substrate 10 is transported to the fourth process module 250 using the robot arm 215. A first gate electrode including polysilicon is formed on the gate oxide layer.

In step S160, a second gate electrode may be further formed on the first gate electrode. The second gate electrode may be formed in a chamber for depositing metal. The second gate electrode may include a material used for reducing a resistance of the first gate electrode, for example, tungsten, tungsten silicide or titanium silicide.

The substrate 10 is unloaded from the apparatus 200 through the load-lock chamber 70 and the substrate transferring unit 50.

Figure 5:
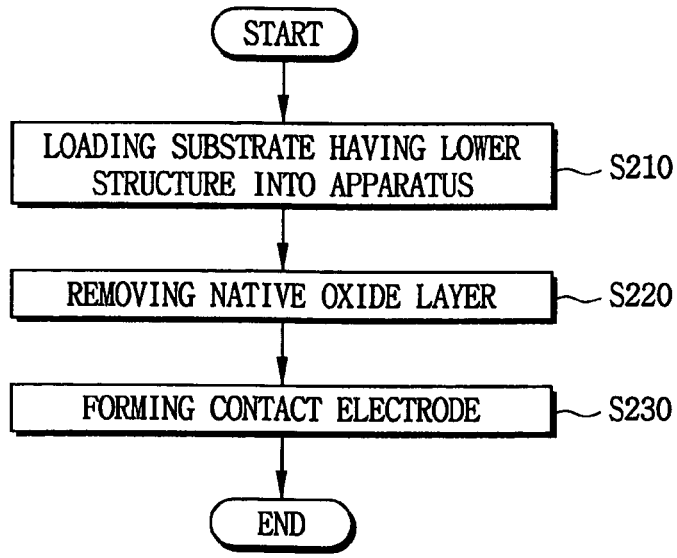
FIG. 5 is a flow chart illustrating a method of forming a contact electrode in accordance with an embodiment of the present invention.

Referring to FIG. 5, in step S210, a substrate having a lower structure is loaded into the apparatus in accordance with an embodiment of the present invention. In step S220, a native oxide layer is removed from the substrate. In step S230, a contact electrode is formed on the substrate.

The method of forming the contact electrode may be carried out using the apparatus 300 in accordance with one embodiment of the present invention.

Referring to FIGS. 3 and 5, in step S210, the substrate 10 having the lower structure is loaded into the apparatus 300 using the robot arm 315. The lower structure may include a gate oxide layer pattern and first and second gate electrode patterns.

In step 220, the substrate 10 is transported to the first process module 320 using the robot arm 315. The native oxide layer may be removed by a wet cleaning process using hydrogen fluoride.

According to the method, the gate structure having the gate oxide layer that has a thickness of below about 15 Å may be formed using the apparatus. Further, the method is performed on the single substrate so that processing conditions of the complex process may be accurately controlled.

According to an embodiment of the present invention, the single-substrate type clustered apparatus for forming a gate oxide layer that has a thickness of below about 15 Å may be provided. Therefore, the single-substrate type clustered apparatuses for forming a gate electrode and a contact electrode, respectively, may be further provided.

Furthermore, since the gate oxide layer and the gate electrode or the lower structure and the contact electrode may be continuously formed under vacuum, a semiconductor device having a thin gate oxide layer on which a native oxide layer may grow by little may be manufactured, thereby improving reliability of the semiconductor device.

Although the present invention has been described in connection with a single-substrate type clustered apparatus, one skilled in the art will appreciate that the principles of the present invention may be equally applied to other type of clustered apparatus.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. An apparatus for manufacturing a semiconductor device, the apparatus comprising:
 a polyhedral transfer chamber;
 a first process module for forming a gate dielectric layer by ALD, the first process module in communication with a first side of the transfer chamber;
 a second process module for thermally treating the gate dielectric layer, the second process module in communication with a second side of the transfer chamber;
 at least one load-lock chamber in communication with a third side of the transfer chamber.

2. The apparatus of claim 1, further comprising another module for forming a first gate electrode on the gate dielectric layer using ALD.

3. The apparatus of claim 2, wherein another module for forming the first gate electrode comprises a chamber for depositing polysilicon.

4. The apparatus of claim 1, further comprising a third process module for forming a second gate electrode on the first gate electrode using CVD, the third process module being in communication with a fourth side of the transfer chamber.

5. The apparatus of claim 4, wherein the third process module comprises a chamber for depositing a metal.

6. The apparatus of claim 4, wherein the second gate electrode comprises tungsten, tungsten silicide or titanium silicide.

7. The apparatus of claim 1, wherein the gate dielectric layer comprises silicon oxide or silicon oxynitride.

8. The apparatus of claim 1, wherein the first process module further comprises still another module for removing a native oxide layer.

9. The apparatus of claim 1, wherein the second process module comprises a rapid thermal annealing (RTA) chamber.

10. The apparatus of claim 1, wherein thermally treating the gate dielectric layer is performed at a temperature of from about 500° C. to about 1,100° C.

11. The apparatus of claim 10, wherein thermally treating the gate dielectric layer comprises densifying the gate dielectric layer formed by the ALD method.

12. A single-substrate type clustered apparatus for forming a gate electrode comprising:
a polyhedral transfer chamber;
a first process module for removing a native oxide layer, the first process module in communication with a first side of the transfer chamber;
a second process module for forming a gate dielectric layer using ALD, the second process module in communication with a second side of the transfer chamber;
a third process module for thermally treating the gate dielectric layer, the third process module in communication with a third side of the transfer chamber;
a fourth process module for forming a first gate electrode using ALD, the fourth process module in communication with a fourth side of the transfer chamber; and
at least one load-lock chamber in communication with a fifth side of the transfer chamber.

13. The apparatus of claim 12, wherein the third process module comprises a RTA chamber.

14. The apparatus of claim 12, wherein the fourth process module comprises a chamber for depositing polysilicon.

15. The apparatus of claim 12, further comprising a fifth process module for forming a second gate electrode, the fifth process module in communication with a sixth side of the transfer chamber.

16. The apparatus of claim 15, wherein the fifth process module comprises a chamber for depositing a metal.

17. A single-substrate type clustered apparatus for forming a contact electrode comprising:
a polyhedral transfer chamber;
a first process module for removing a native oxide layer in communication with a first side of the transfer chamber;
a second process module for forming a contact electrode in communication with a second side of the transfer chamber, wherein the second process module comprises a chemical vapor deposition (CVD) chamber; and
at least one load-lock chamber in communication with a third side of the transfer chamber.

* * * * *